United States Patent
Agrawal et al.

(10) Patent No.: US 9,298,868 B2
(45) Date of Patent: Mar. 29, 2016

(54) HIERARCHICAL PUSHDOWN OF CELLS AND NETS TO ANY LOGICAL DEPTH

(71) Applicant: NVIDIA CORPORATION, Santa Clara, CA (US)

(72) Inventors: Vikas Agrawal, San Jose, CA (US); Shrivathsa Bhargavravichandran, San Jose, CA (US); Binh Pham, San Jose, CA (US); Jay Chen, Sunnyvale, CA (US); Sridhar Krishnamurthy, Santa Clara, CA (US); Umang Shah, San Jose, CA (US); Chi Keung Lee, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 18 days.

(21) Appl. No.: 13/922,120

(22) Filed: Jun. 19, 2013

(65) Prior Publication Data

US 2014/0380257 A1    Dec. 25, 2014

(51) Int. Cl.
G06F 9/45        (2006.01)
G06F 17/50       (2006.01)

(52) U.S. Cl.
CPC .................... *G06F 17/5045* (2013.01)

(58) Field of Classification Search
CPC .......................................... G06F 9/45
USPC .......................................... 716/103
See application file for complete search history.

(56) References Cited

U.S. PATENT DOCUMENTS 8,271,728 B2 *   9/2012   Strumper et al. ............. 711/118
9,043,452 B2 *   5/2015   Fulton ................. H04L 41/0896
                                                          707/714

\* cited by examiner

*Primary Examiner* — Thuan Do
(74) *Attorney, Agent, or Firm* — Artegis Law Group, LLP (57) ABSTRACT

A technique for generating pushdown data comprises performing logical pushdown of circuit elements and nets and detecting physical pushdown based on partition boundary crossings. Geometry associated with one logical level may be used as a keep-out region for the same physical layer when generating physical design of a different logical level. The technique may advantageously enable concurrent design in both top-level and low-level physical design phases, thereby reducing overall design cycle time in developing an integrated circuit.

20 Claims, 7 Drawing Sheets

HIERARCHICAL PUSHDOWN OF CELLS AND NETS TO ANY LOGICAL DEPTH

BACKGROUND OF THE INVENTION

1. Field of the Invention

The invention relates generally to computer automated design of integrated circuits and, more specifically, to hierarchical pushdown of cells and nets in logical depth.

2. Description of the Related Art

Conventional physical design techniques for integrated circuits employ a hierarchical representation of circuit elements, with top-level circuit structures constraining lower-level structures. For example, physical design of a top-level clock grid may constrain floor-planning and placement of low-level circuit elements coupled to the clock grid. Following conventional techniques, the top-level clock grid is first designed to completion and verified before physical design of low-level circuit elements coupled to the clock grid may be completed.

During the course of completing a final integrated circuit design, the clock grid may need to change, the low-level circuit elements may need to change, and/or the physical design of the low-level circuit elements may need to change. A change on any level may require a design effort at all levels of hierarchy to accommodate the change. Each design effort on each level of hierarchy typically requires a significant amount of time to complete. Because lower levels are conventionally constrained by and sequentially dependent on higher levels, design efforts associated with each level of hierarchy are serialized, leading to lengthy design cycles and inefficient use of design resources. Furthermore, the scope of design change that may be effected on a full-chip structure is highly constrained because such a change would require a major redesign at all levels of hierarchy.

As the foregoing illustrates, what is needed in the art is a technique that enables greater design efficiency in hierarchical integrated circuit designs.

SUMMARY OF THE INVENTION

One embodiment of the present invention sets forth a computer-implemented method for generating pushdown structures. The method includes receiving a first set of circuit structures associated with an integrated circuit, receiving partition boundary information associated with the integrated circuit, performing a logical pushdown of the first set of circuit structures to amend a second set of circuit structures associated with the integrated circuit, and performing a physical pushdown of the first set of circuit structures to amend the second set of circuit structures. The method also includes detecting at least one circuit structure remaining in the first set of circuit structures, and storing a data set corresponding to the second set of circuit structures, where the data set includes at least one logical pushdown structure and at least one physical pushdown structure corresponding to the at least one logical pushdown structure.

Other embodiments of the present invention include, without limitation, a computer-readable storage medium including instructions that, when executed by a processing unit, cause the processing unit to perform the techniques described herein as well as a computing device that includes a processing unit configured to perform the techniques described herein.

One advantage of the disclosed technique is that top-level and low-level design phases may commence concurrently rather than sequentially, thereby enabling far greater design efficiency in complex, hierarchical integrated circuit designs.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

System Overview

Figure 1:
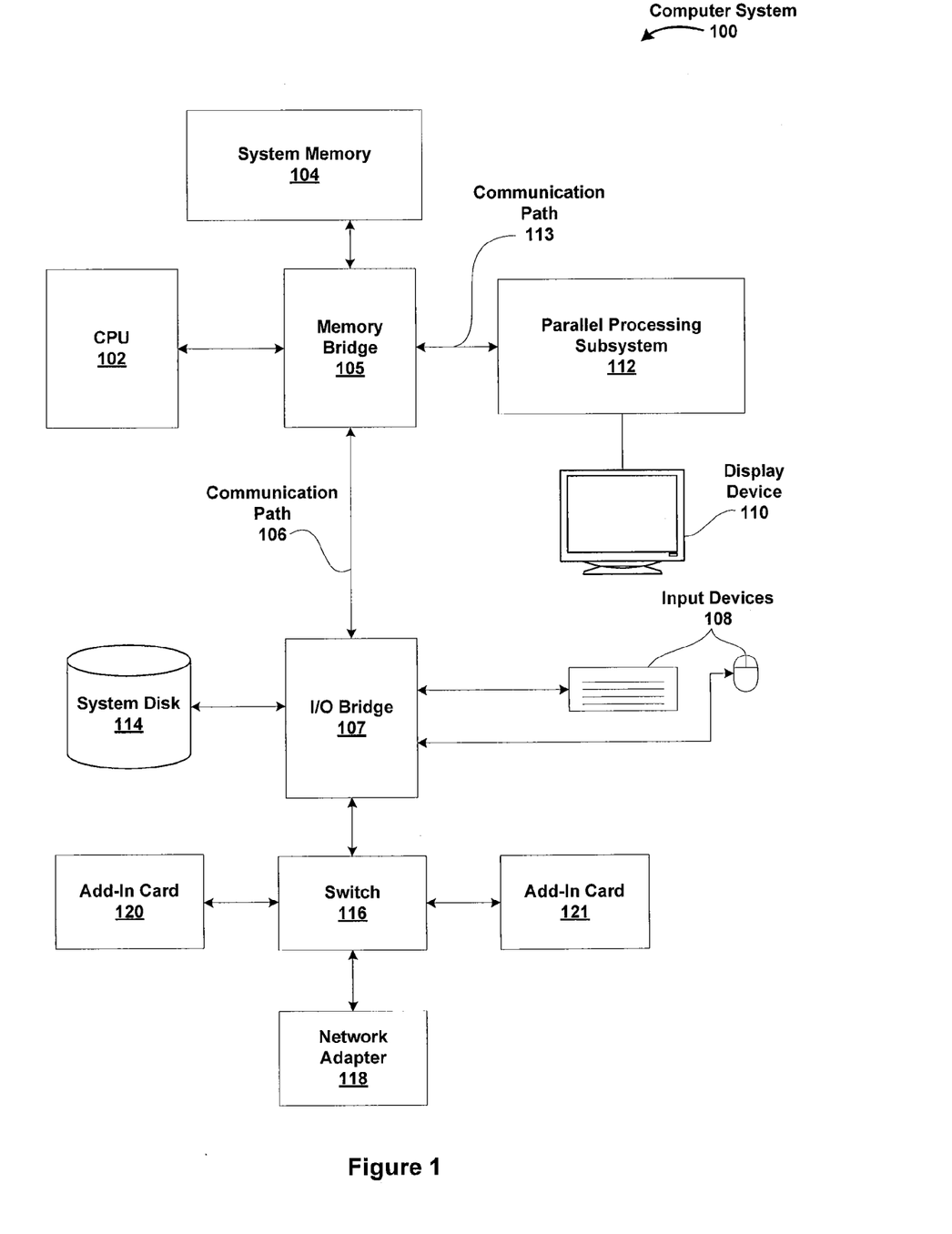
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 configured to communicate via an interconnection path that may include a memory bridge 105. Memory bridge 105, which may be, e.g., a Northbridge chip, is connected via a bus or other communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse) and forwards the input to CPU 102 via communication path 106 and memory bridge 105. A parallel processing subsystem 112 is coupled to memory bridge 105 via a bus or other communication path 113 (e.g., a PCI Express, Accelerated Graphics Port, or HyperTransport link); in one embodiment parallel processing subsystem 112 is a graphics subsystem that delivers pixels to a display device 110 (e.g., a conventional CRT or LCD based monitor). A graphics driver 103 may be configured to send graphics primitives over communication path 113 for parallel processing subsystem 112 to generate pixel data for display on display device 110. A system disk 114 is also connected to I/O bridge 107. A switch 116 provides connections between I/O bridge 107 and other components such as a network adapter 118 and various add-in cards 120 and 121. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI-Express, AGP (Accelerated Graphics Port), HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Certain embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

In one embodiment, computer system 100 is configured to execute computer aided design (CAD) tools for integrated circuit design, such as floor-planning, place and route, and other physical design tasks. A pushdown data tool may be configured to practice techniques taught herein. The pushdown data tool is configured to receive a file, such as a design exchange format (DEF) file, that includes both logical and physical top-level structures (cells, nets) to be pushed into partitions within an overall design, and partition boundary information. The partition boundary information may be formatted in any technically feasible format, such as a schema for the popular extensible markup language (XML). The pushdown data tool is also configured to generate an output file, such as a DEF file that contains formerly top-level elements that are now associated with a partition, along with logical connectivity between the elements. These formerly top-level elements are referred to herein as pushdown elements. The pushdown elements may include, without limitation, physical net segments and instance locations, newly created pins were top-level nets crossed partition boundaries creating physical pushdown elements, physical cells instances, and logical cell instances. The pushdown data tool is further configured to generate a netlist file, for example using the well-known Verilog hardware description language format, which includes logical connectivity information comprising logical pushdown elements.

Technique for Hierarchical Pushdown

Figure 2:
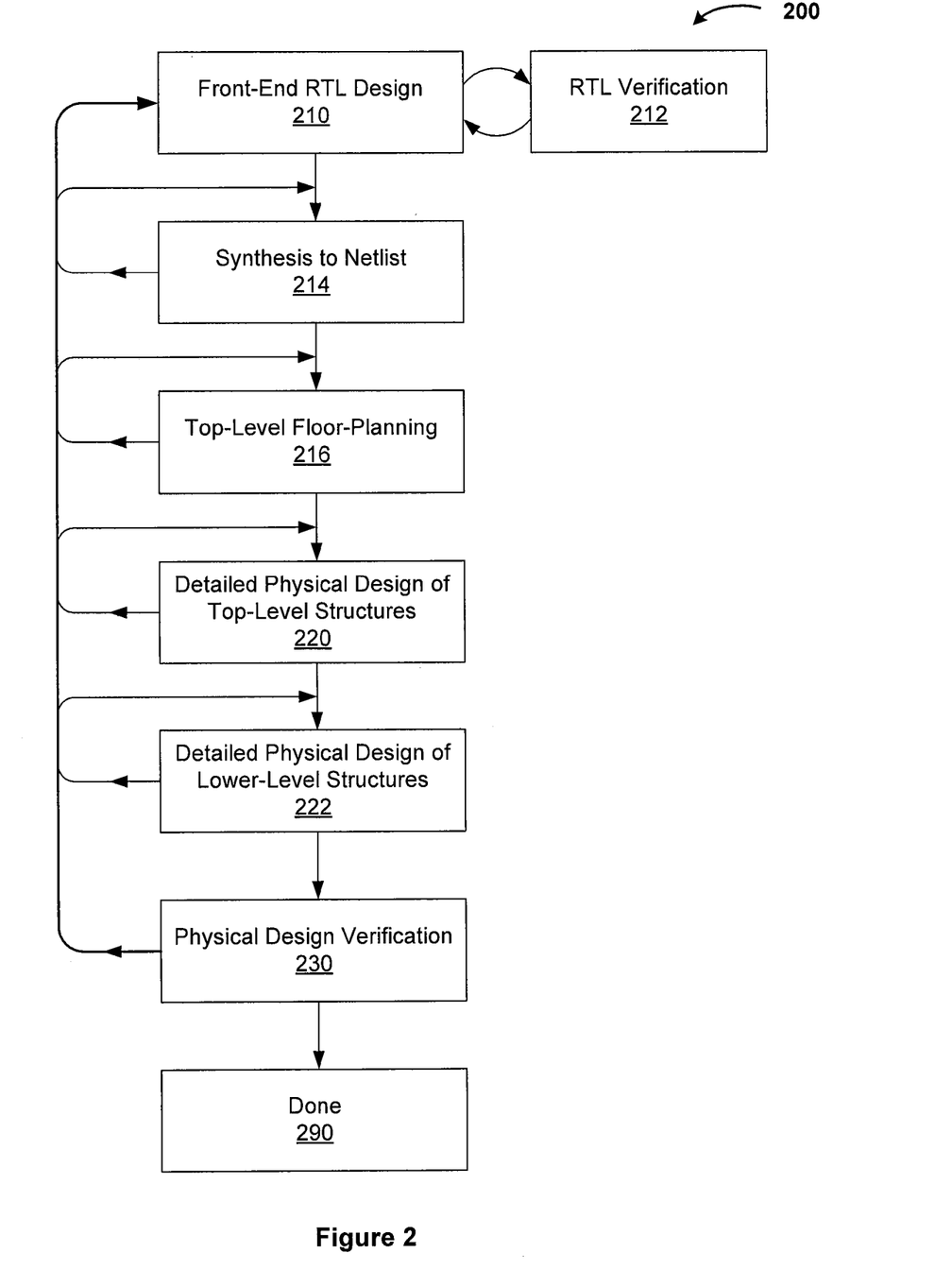
FIG. 2 illustrates an integrated circuit design flow, according to one embodiment of the present invention.

FIG. 2 illustrates an integrated circuit design flow 200, according to one embodiment of the present invention. As shown, the design flow begins with a front-end register transfer level (RTL) design 210 phase and concludes with verified physical design that corresponds to the RTL design.

An RTL design generated in RTL design phase 210 may include portions of code written by hand and portions of code that are automatically generated, or any combination thereof. In certain settings, high-level design tools are used to generate substantial portions of RTL code from abstract specifications. The RTL design needs to be functionally correct as well as structurally suitable to meet certain physical design constraints related to operational timing and physical area. An RTL verification phase 212 is performed to validate logical correctness of the RTL design. Errors discovered during RTL verification may be fixed prior to or concurrently with a synthesis to netlist phase 214, whereby the RTL design is transformed into a netlist comprising logical cell references and nets connecting the cells. In this design phase, timing and area constraints may be estimated and the synthesis process may be directed to meet any stated constraints. RTL verification should be satisfied before a final netlist is generated. In certain scenarios, a particular RTL design may not meet the constraints set forth in synthesis. Here, the RTL design phase 210 needs to be revisited in light of synthesis results.

A top-level floor-planning phase 216 is performed to place major circuit structures and certain top-level structures, such as global clock grids and power distribution grids. Certain interconnection layers, known as metal layers and via layers, are conventionally reserved for top-level structures, designed in a detailed physical design phase of top-level structures 220. In this top-level design phase, certain regions in multiple lithographic layers may be required to implement the top-level structures. These regions become keep-out regions for a subsequent detailed physical design phase of lower-level structures 222. In this design phase, logical circuit designs for low-level structures are rendered as physical designs that also require multiple lithographic layers. In particular, the low-level structures define geometry in diffusion layers as well as interconnect layers. In any design phase, a certain constraint may be unattainable, resulting in a redesign in one or more previous design phases to accommodate and meet the constraint. A physical design verification phase 230 includes design rule checking, cross-talk analysis, and the like. Certain design tools combine two or more of the physical design phases, and optionally synthesis to netlist phase 214, into a common tool.

Figure 3A:
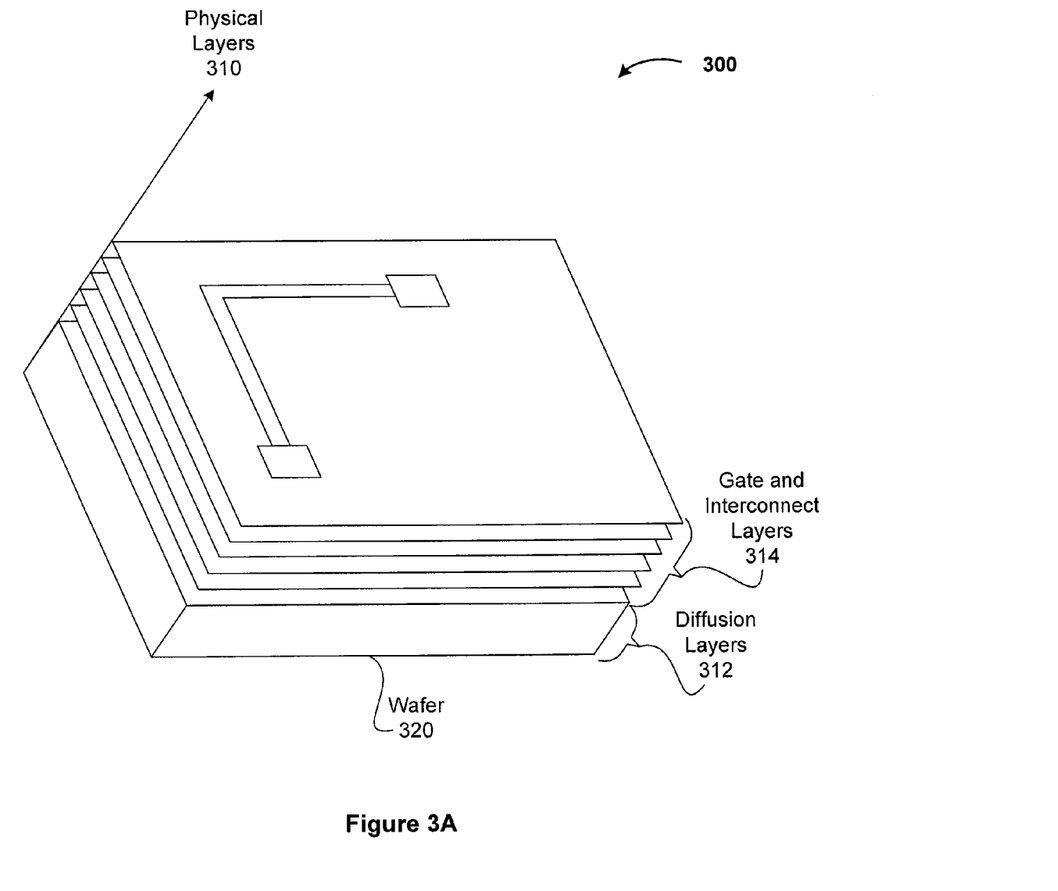
FIG. 3A illustrates physical layers comprising an integrated circuit, according to one embodiment of the present invention.

FIG. 3A illustrates physical layers 310 comprising an integrated circuit 300, according to one embodiment of the present invention. The physical layers correspond to lithographic processing steps. Diffusion layers 312 are fabricated within a wafer 320, while gate and interconnect layers 314 are fabricated in sequential layers above the diffusion layers. Each one of the physical layers may include geometry from an arbitrary logical level. In certain design flows, upper metal layers are reserved for top-level circuit structures such as global clock grids. While this approach yields correct results, reserving layers in this way is inefficient and over-constrains low-level physical design. To address this inefficiency in conventional design methodologies, embodiments of the present invention enable a top-level physical design phase, such as design phase 220 of FIG. 2, to generate geometry that coexists on the same physical layer with geometry generated by a low-level design phase, such as design phase 222.

Figure 3B:
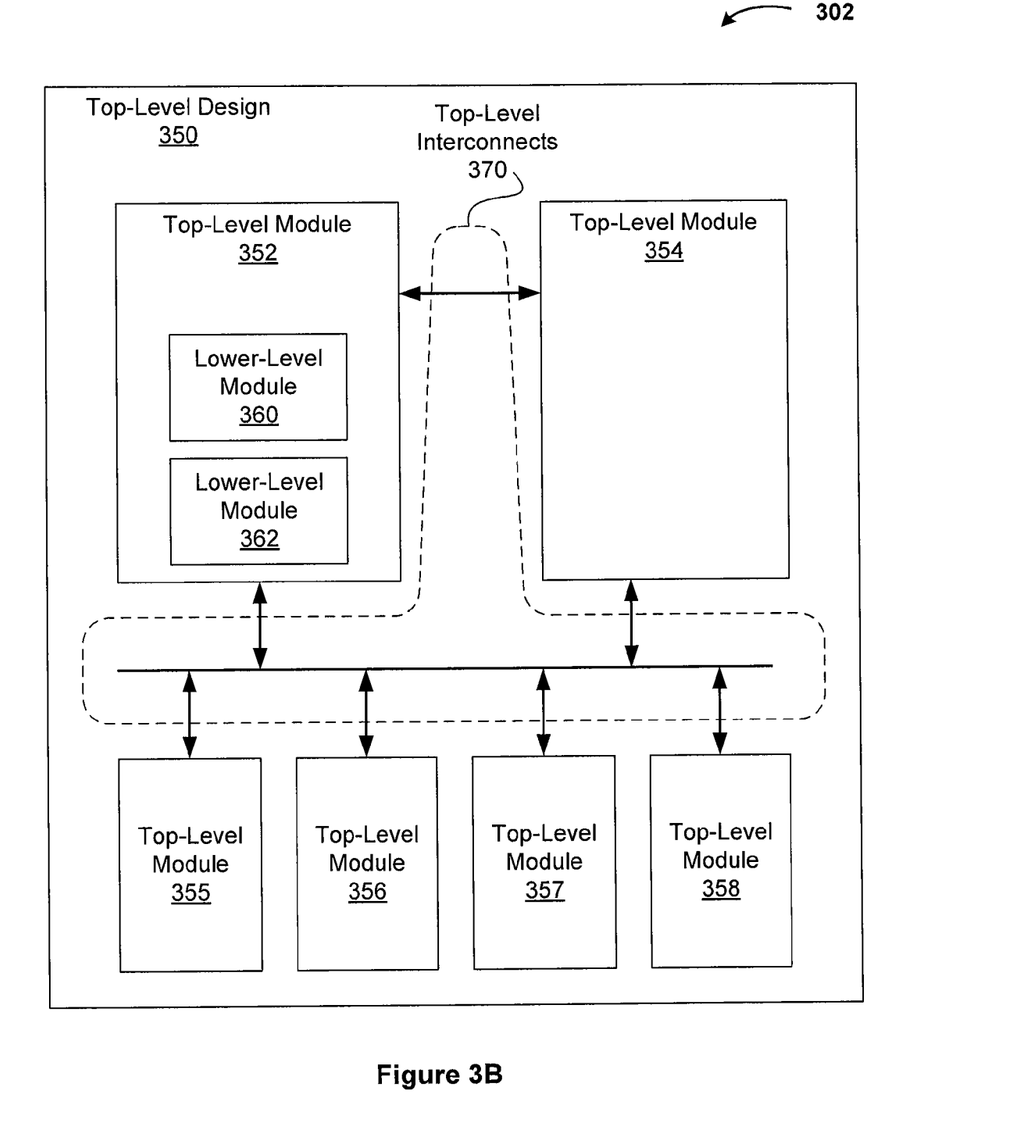
FIG. 3B illustrates logical levels comprising an integrated circuit, according to one embodiment of the present invention.

FIG. 3B illustrates logical levels comprising an integrated circuit 302, according to one embodiment of the present invention. As shown, a top-level design 350 for the integrated circuit 302 includes top-level interconnects, and top-level module instances 352, 354, 355-358. As shown, top-level module 352 also includes lower-level modules 360, 362. While the top-level modules and the top-level interconnects may be logically distinct, each may include physical design geometry disposed above or below other physical design elements of the integrated circuit 302 on different layers. Furthermore, interconnections and active circuit cells associated with one top-level module or top-level interconnect may be routed or placed within boundaries of other top-level modules or associated lower-level modules. For example, wires comprising a top-level clock grid may be routed over a given top-level module to provide the top-level module with clock signals. Furthermore, buffers associated with the top-level clock grid may be placed within the top-level module next to cells comprising the top-level module.

Circuit elements, such as wires and active circuitry, associated with top-level structures may be pushed down to lower-level logical hierarchies for final physical design. However, the top-level structures may be kept logically distinct from recipient cells. Here, the top-level structures that are pushed down comprise pushdown data that provides design details for the structures. The pushdown data is tracked as being associated with top-level (or higher-level) structures. In one embodiment, an engineering change order (ECO) mechanism conventionally available within integrated circuit design tools is configured to receive the pushdown data and to modify related physical and logical structures associated with the pushdown data. Low-level structures need not be affected otherwise by changes in the pushdown data.

Figure 4:
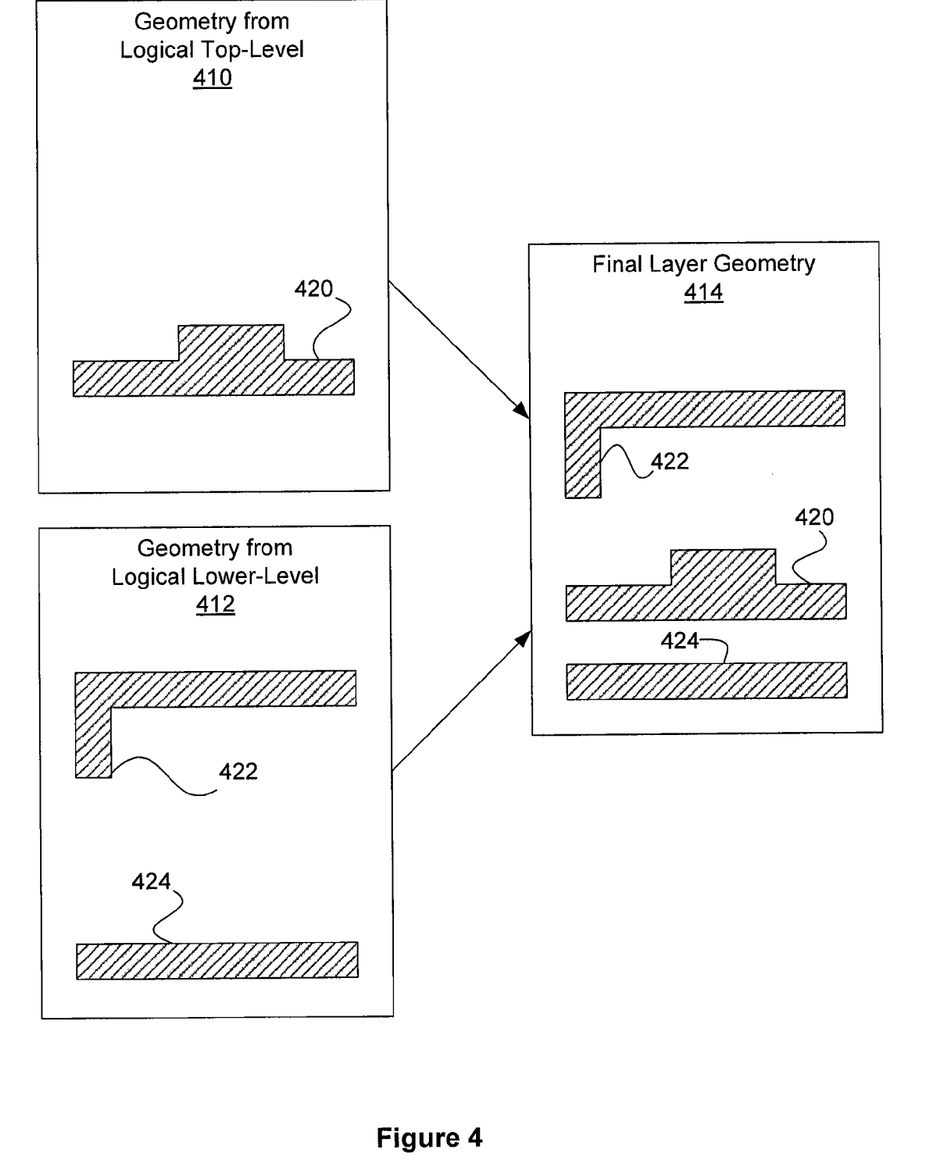
FIG. 4 illustrates a final layer geometry generated from geometry associated with two different logical levels of an integrated circuit, according to one embodiment of the present invention.

FIG. 4 illustrates a final layer geometry 414 generated from geometry associated with two different logical levels of an integrated circuit, according to one embodiment of the present invention. Here, final layer geometry 414 includes geometry from a logical top-level 410, comprising element 420, and geometry from a logical lower-level 412, comprising elements 422, 424.

In one usage scenario, a detailed physical design of top-level structures phase is completed prior to a lower-level design phase. In this scenario, element 422 comprises pushdown data and becomes a keep-out region for a physical layer associated with the final layer geometry 414. During a detailed physical design of lower-level structures phase, new geometry may not be added within the keep-out region of the physical layer. In another scenario, a detailed physical design of lower-level structures design phase is completed prior to a top-level design phase. Here, elements 420, 424 comprise keep-out regions for a subsequent detailed physical design of top-level structures phase. Upon completing a final layer geometry 414, a checkpoint may be established reflecting elements 420, 422, and 424, each with a logical level affiliation, and each acting as a keep-out region for a different logical level physical design phase.

Figure 5:
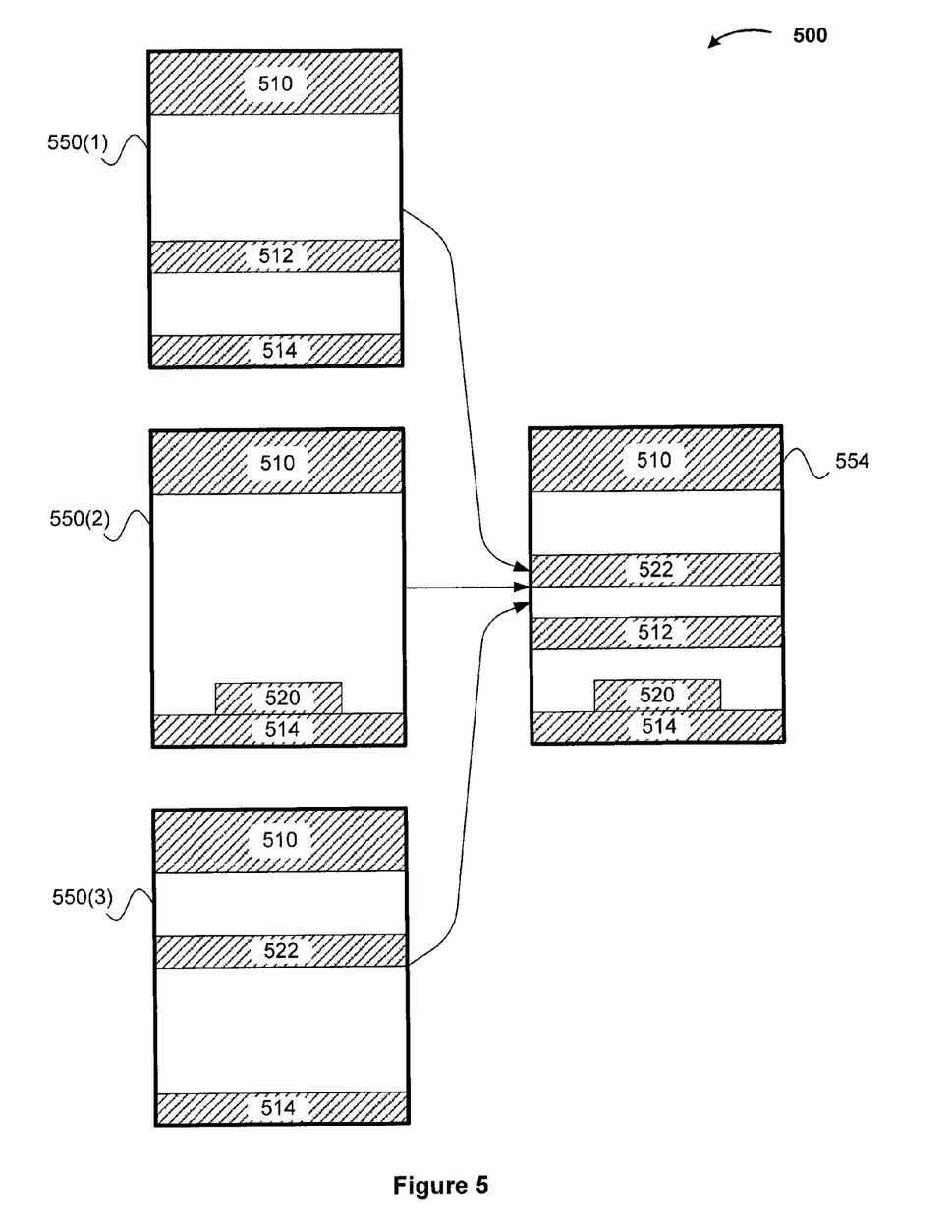
FIG. 5 illustrates keep-out regions associated with different variations of a replicated partition, according to one embodiment of the present invention.

FIG. 5 illustrates keep-out regions associated with different variations of a replicated partition, according to one embodiment of the present invention. A partition in this setting comprises a logical unit within an integrated circuit. A replicated partition comprises a logical unit that is instantiated two or more times. In one replication scenario, identical physical design macros are placed within an integrated circuit, such as integrated circuit 302 of FIG. 3B. For example, top-level module 355 and top-level module 356 may be replicated partitions having a substantially identical physical design. However, instantiating identical physical design is not always efficient, and variations on the physical design are frequently desirable. In another replication scenario, three variations of a partition are designed. A portion of a physical design layer for the first variation is depicted as region 550(1), a corresponding portion for the second variation is depicted as region 550(2), and a corresponding portion for the third variation is depicted as region 550(3). Each region includes common elements 510, 514. However, region 550(1) uniquely includes element 512, while region 550(2) uniquely includes element 520, and region 550(3) uniquely includes element 522. A keep-out region, as described above, is generated to include a union region 554 comprising of elements 510, 512, 514, 520, and 522. The keep-out region may be used when performing a detailed physical design of top-level structures. For example, the union region 554 may be used in a checkpoint. However, once a specific variation is selected and placed in the context of top-level structures, elements not associated with a particular variation may be removed to generate a new checkpoint and final design. For example, if a variation of a partition associated with region 550(2) is selected, then only elements 510, 520, and 514 need persist after the partition is placed and coupled to top-level interconnections.

Figure 6:
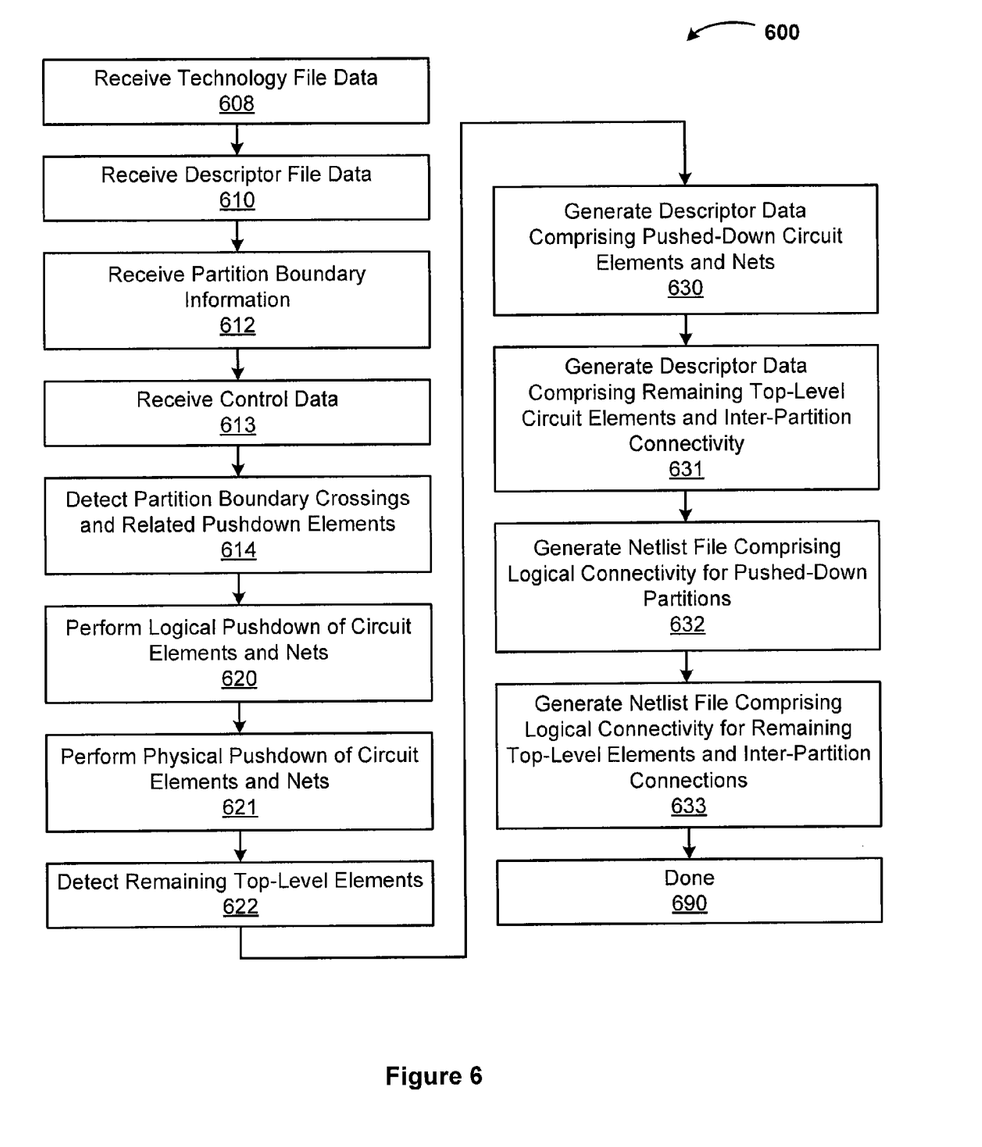
FIG. 6 sets forth a flowchart of method steps for generating pushdown elements, according to one embodiment of the present invention.

FIG. 6 sets forth a flowchart of method steps for generating pushdown elements, according to one embodiment of the present invention. Although the method steps are described in conjunction with the system of FIG. 1, persons of ordinary skill in the art will understand that any system configured to perform the method steps, in any order, is within the scope of the invention. In one embodiment, the method steps are performed by a design automation application executing on CPU 102 of FIG. 1.

As shown, a method 600 begins in step 608, where the design automation application receives data from a technology file, for example, from a Library Exchange Format (LEF) file. The technology file may include technology rules, such as per-layer minimum routing width, minimum layer spacing, and the like. In step 610, the design automation application receives data from a descriptor file, for example, from a DEF file. The descriptor file includes logical structures and physical structures to be incorporated in a physical design. In step 612, the design automation application receives partition boundary information comprising logical and physical partition boundaries. Physical boundary information may include offsets for corresponding objects from a reference full-chip coordinate system. Each offset identifies a geometric object and hierarchical level affiliation of the geometric object. In step 613, the design automation application receives user-specified control data that can instruct the design automation application, for example, to consider or ignore certain partitions specified in the partition boundary information received in step 612, or to consider or ignore certain metal layers associated with pushdown information received in step 610, or to consider or ignore certain logical nets and their physical manifestation associated with pushdown information received in step 610. In addition, the user-specified control data may specify which technology rules received in step 608, if any, should be ignored while processing pushdown elements.

In step 614, the design automation application processes the boundary information received in step 612, the descriptor information received in step 610, and the user-control data received in step 613 to determine relevant partition boundary crossings and elements of interest to be pushed down. In step 620, the design automation application performs a logical pushdown of relevant circuit elements and nets. Here, top-level (or higher-level) structures are pushed down into low-level structures where the boundaries of such low-level structures overlapped with top-level structures, amending the logical description of the low-level structures. In step 621, the design automation application detects physical pushdown based on partition boundary crossings. In step 622, the design automation application detects elements that remain at the top-level after the pushdown process completes. In one embodiment, top-level elements that did not overlap with partition boundaries remain at the top-level. When top-level elements, in whole or part, traverse the boundary of two adjacent partitions, the amended logical connectivity between the adjacent partitions is maintained at the top-level. Such top-level data is also formatted in the output process as descriptor file (e.g., DEF) and netlist.

In step 630, the design automation application generates descriptor file data, for example formatted as a DEF data, with pushed-down circuit elements and nets. The DEF data may comprise netlist information and logical connectivity as well as physical design information. In step 631, the design automation application generates descriptor file data comprising remaining top-level elements that were not pushed down. Replication information, as described above in FIG. 5, may be included in the DEF data. In step 632, the design automation application generates a netlist file comprising logical connectivity for partitions. In step 633, the design automation application generates a netlist file comprising logical connectivity for any remaining top-level elements, as well as inter-partition connectivity for elements that were pushed down into the partition in step 621. The DEF data, or the DEF data in combination with the netlist file comprise a design checkpoint, which may be used to constrain a subsequent design phase. In one embodiment, the netlist file is structured to conform to a structural subset of the well-known Verilog language. The method terminates in step 690.

In sum, a technique for generating pushdown data is disclosed, whereby circuit structures associated with a logical hierarchy are pushed from a top-level to a low-level, and geometry within a specific physical layer may be associated with one logical level as keep-out regions for physical design associated with a different logical level. Such keep-out regions are included in a checkpoint, which allows different design phases to commence concurrently with respect to the checkpoint.

One advantage of the disclosed technique is that top-level and low-level design phases may commence concurrently rather than sequentially, thereby enabling far greater design efficiency in complex, hierarchical integrated circuit designs.

While the foregoing is directed to embodiments of the invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the invention.

In view of the foregoing, the scope of the invention is determined by the claims that follow.

What is claimed is:

1. A computer-implemented method for automatically generating pushdown structures when designing integrated circuits using an integrated circuit design tool, the method comprising:
   receiving a first set of circuit structures associated with an integrated circuit;
   receiving partition boundary information associated with the integrated circuit;
   performing a logical pushdown of the first set of circuit structures into a second set of circuit structures associated with the integrated circuit, wherein each circuit structure in the first set that is logically pushed down into the second set overlaps at least one circuit structure in the second set, and wherein the logical pushdown amends a logical description of each circuit structure in the second set;
   performing a physical pushdown of the first set of circuit structures into the the second set of circuit structures based one or more partition boundaries; and
   storing a data set corresponding to the second set of circuit structures, wherein the data set includes at least one logical pushdown structure and at least one physical pushdown structure corresponding to the at least one logical pushdown structure.

2. The method of claim 1, further comprising:
   generating a logical netlist associated with the second set of circuit structures; and
   storing the logical netlist within a netlist file.

3. The method of claim 2, wherein the netlist file is generated according to the Verilog hardware description language.

4. The method of claim 1, further comprising detecting at least one circuit structure that remains in the first set of circuit structures after performing the logical pushdown and the physical pushdown based on physical location of the one of the circuit structures and offset information associated with the partition boundary information.

5. The method of claim 4, wherein the physical location comprises one or more offsets within a chip level coordinate system.

6. The method of claim 1, wherein the data set further includes a keep-out region associated with a physical layer and a logical level.

7. The method of claim 6, wherein the logical level comprises an interconnect level.

8. The method of claim 6, wherein the keep-out region is associated with a clock grid.

9. The method of claim 1, wherein the second data set comprises an engineering change order descriptor.

10. A computer-readable storage medium including instructions that, when executed by a processor, cause the processor to generate pushdown structures, by performing the steps of:
   receiving a first set of circuit structures associated with an integrated circuit;
   receiving partition boundary information associated with the integrated circuit;

performing a logical pushdown of the first set of circuit structures to amend a second set of circuit structures associated with the integrated circuit;

performing a physical pushdown of the first set of circuit structures to amend the second set of circuit structures;

detecting at least one circuit structure that remains in the first set of circuit structures after performing the logical pushdown and the physical pushdown; and storing a data set corresponding to the second set of circuit structures, wherein the data set includes at least one logical pushdown structure and at least one physical pushdown structure corresponding to the at least one logical pushdown structure.

11. The computer-readable storage medium of claim 10, further comprising:

generating a logical netlist associated with the second set of circuit structures; and storing the logical netlist within a netlist file.

12. The computer-readable storage medium of claim 11, wherein the netlist file is generated according to the Verilog hardware description language.

13. The computer-readable storage medium of claim 10, wherein detecting is based on physical location of the one of the circuit structures and offset information associated with the partition boundary information.

14. The computer-readable storage medium of claim 13, wherein the physical location comprises one or more offsets within a chip level coordinate system.

15. The computer-readable storage medium of claim 10, wherein the data set further includes a keep-out region associated with a physical layer and a logical level.

16. The computer-readable storage medium of claim 15, wherein the logical level comprises an interconnect level.

17. The computer-readable storage medium of claim 15, wherein the keep-out region is associated with a clock grid.

18. The computer-readable storage medium of claim 10, wherein the second data set comprises an engineering change order descriptor.

19. A computing device, comprising:

a memory storing a design automation application; and a processor that, upon executing the design automation application, is configured to:

receive first set of circuit structures associated with an integrated circuit;

receive partition boundary information associated with the integrated circuit;

perform a logical pushdown of the first set of circuit structures into a second set circuit structures associated with the integrated circuit, wherein each circuit structure in the first set that is logically pushed down into the second set overlaps at least one circuit structure in the second set, and wherein the logical pushdown amends a logical description of each circuit structure in the second set;

detect at least one circuit structure that remains in the first set of circuit structures after performing the logical pushdown; and store a data set corresponding to the second set of circuit structures, wherein the data set includes at least one logical pushdown structure.

20. The computing device of claim 19, wherein the processor is further configured to generate a logical netlist associated with the second set of circuit structures, and store the logical netlist within a netlist file.

* * * * *

UNITED STATES PATENT AND TRADEMARK OFFICE
CERTIFICATE OF CORRECTION

PATENT NO. : 9,298,868 B2  
APPLICATION NO. : 13/922120  
DATED : March 29, 2016  
INVENTOR(S) : Vikas Agrawal et al.

Page 1 of 1

It is certified that error appears in the above-identified patent and that said Letters Patent is hereby corrected as shown below:

IN THE CLAIMS:

Column 8, Line 29, Claim 1, please delete the second occurrence of "the".

Signed and Sealed this
Fourteenth Day of June, 2016

Michelle K. Lee  
*Director of the United States Patent and Trademark Office*